US007588950B2

(12) United States Patent   (10) Patent No.: US 7,588,950 B2
Kim   (45) Date of Patent: Sep. 15, 2009

(54) TEST PATTERN FOR RELIABILITY MEASUREMENT OF COPPER INTERCONNECTION LINE HAVING MOISTURE WINDOW AND METHOD FOR MANUFACTURING THE SAME

(75) Inventor: Sang-Young Kim, Ichon-shi (KR)

(73) Assignee: MagnaChip Semiconductor, Ltd., Chungcheonbuk-Do (KR)

( * ) Notice: Subject to any disclaimer, the term of this patent is extended or adjusted under 35 U.S.C. 154(b) by 392 days.

(21) Appl. No.: 10/882,536

(22) Filed: Jun. 30, 2004

(65) Prior Publication Data

US 2005/0106764 A1   May 19, 2005

(30) Foreign Application Priority Data

Nov. 18, 2003   (KR) .................. 10-2003-0081395

(51) Int. Cl.
*H01L 21/66* (2006.01)
*G01R 31/26* (2006.01)

(52) U.S. Cl. .................. 438/18; 438/11; 438/622; 257/E21.521; 257/E21.575; 257/E23.169

(58) Field of Classification Search .................. 438/4, 438/14, 17, 18, 612, 618, 619, 622, 626, 438/627, 637, 638, 687, 688, 927, FOR. 101, 438/FOR. 102, FOR. 358, 10, 11, 13, FOR. 142; 257/48, E21.531, E21.521, E21.524, E21.575, 257/E23.169, 758, 762, 773, 774; 702/117, 702/118; 73/73, 335.02, 335.05, 31.07; 324/763–767, 324/769
See application file for complete search history.

(56) References Cited

U.S. PATENT DOCUMENTS 5,126,662 A * 6/1992 Jinbo .................. 324/766
5,216,280 A * 6/1993 Tanaka et al. .................. 257/734
5,777,486 A * 7/1998 Hsu .................. 324/763
5,824,599 A * 10/1998 Schacham-Diamand et al. .................. 438/678
5,900,645 A * 5/1999 Yamada .................. 257/48
5,920,081 A * 7/1999 Chen et al. .................. 257/48
6,091,080 A * 7/2000 Usui .................. 257/48
6,163,161 A * 12/2000 Neeb .................. 324/760
6,362,528 B2 * 3/2002 Anand .................. 257/758
2001/0030366 A1* 10/2001 Nakano et al. .................. 257/758
2002/0121703 A1* 9/2002 Toyoda et al. .................. 257/762
2004/0207383 A1* 10/2004 Wang .................. 324/71.2

FOREIGN PATENT DOCUMENTS

JP   11-031727   2/1999
KR   1020000075237   12/2000

* cited by examiner

*Primary Examiner*—Matthew Smith
*Assistant Examiner*—Quovaunda Jefferson
(74) *Attorney, Agent, or Firm*—Blakely, Sokoloff, Taylor & Zafman LLP (57) ABSTRACT

Disclosed is a test pattern for a reliability measurement of a copper interconnection line having a moisture window and a method for manufacturing the same. The method includes the steps of: a first inter-layer insulation layer formed on the substrate; a plurality of bottom copper interconnection lines buried in the first inter-layer insulation layer; a second inter-layer insulation layer on the plurality of bottom copper interconnection lines and the first inter-layer insulation layer; a plurality of top copper interconnection lines filled in the second inter-layer insulation layer and connected to the plurality of bottom copper interconnection lines through the plurality of via contacts; and a passivation layer covering the plurality of top copper interconnection lines and having a plurality of moisture windows in which moistures are flown during an electro migration (EM) test.

3 Claims, 6 Drawing Sheets

TEST PATTERN FOR RELIABILITY MEASUREMENT OF COPPER INTERCONNECTION LINE HAVING MOISTURE WINDOW AND METHOD FOR MANUFACTURING THE SAME

FIELD OF THE INVENTION

The present invention relates to a method for a test pattern; and more particularly to a test pattern capable of measuring an electro migration.

DESCRIPTION OF RELATED ARTS

A method for measuring an electro migration (EM) is used for testing a reliability of an interconnection line of a semiconductor device. In general, an EM phenomenon metal atoms move is taken place between the semiconductor devices, and more particularly between metal interconnection lines within the semiconductor devices. The EM phenomenon deteriorates the semiconductor devices and causes a mis-operation of the semiconductor devices. Therefore, it is required to understand reasons resulting in the above problems through precisely measuring the EM phenomenon generated between the metal interconnection lines during manufacturing the semiconductor devices, thereby making a proper countermeasure to solve the problems.

As for a typical method for measuring the EM phenomenon, there is a method for measuring a package level EM. However, the method needs a high expense for a package, a high investment for measuring equipment, and a long running time for measuring the EM phenomenon. Recently it is very competitive to develop the semiconductor devices, thus the test requiring not only a high expense for research and development but also a long developing time can cause a very critical problem.

In order to overcome this problem, a method for measuring a wafer level EM is suggested. The method for measuring a wafer level EM is a method performed before a package process has not been finished. The above method has an advantage to reduce a required time and expense compared to the method for measuring a wafer level EM.

Figure 1A:
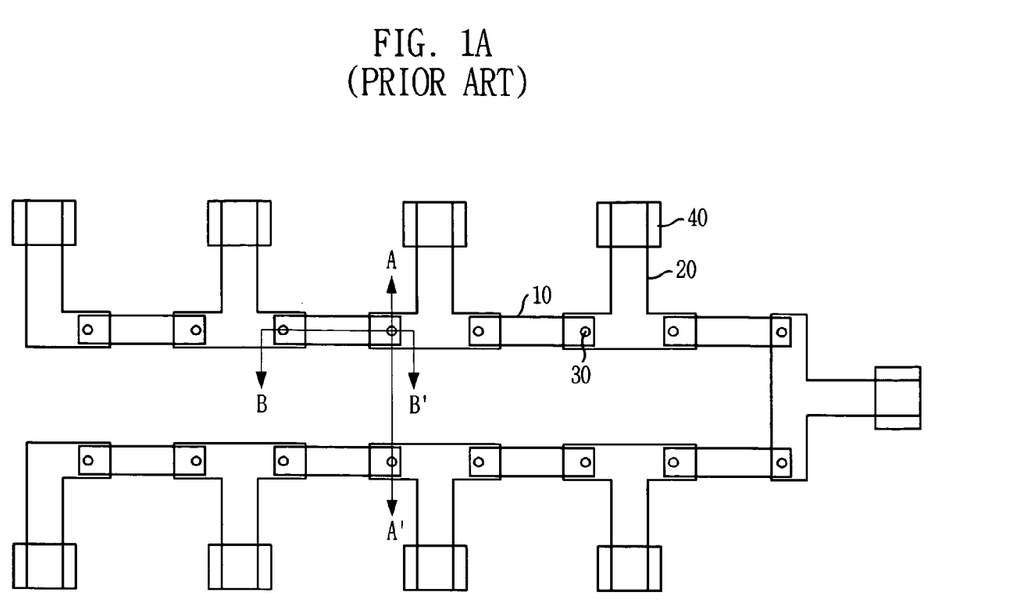
FIG. 1A is a top view illustrating a conventional copper interconnection line structure for an EM measurement.
Figure 1B:
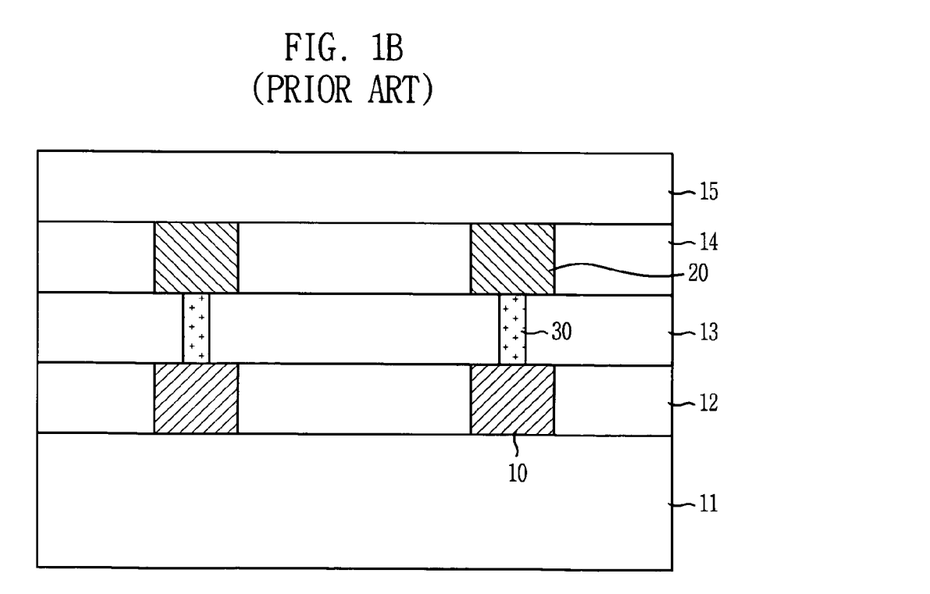
FIG. 1B is a cross-sectional view of the conventional copper interconnection line structure taken along a direction of a line A-A' shown in FIG. 1A.
Figure 1C:
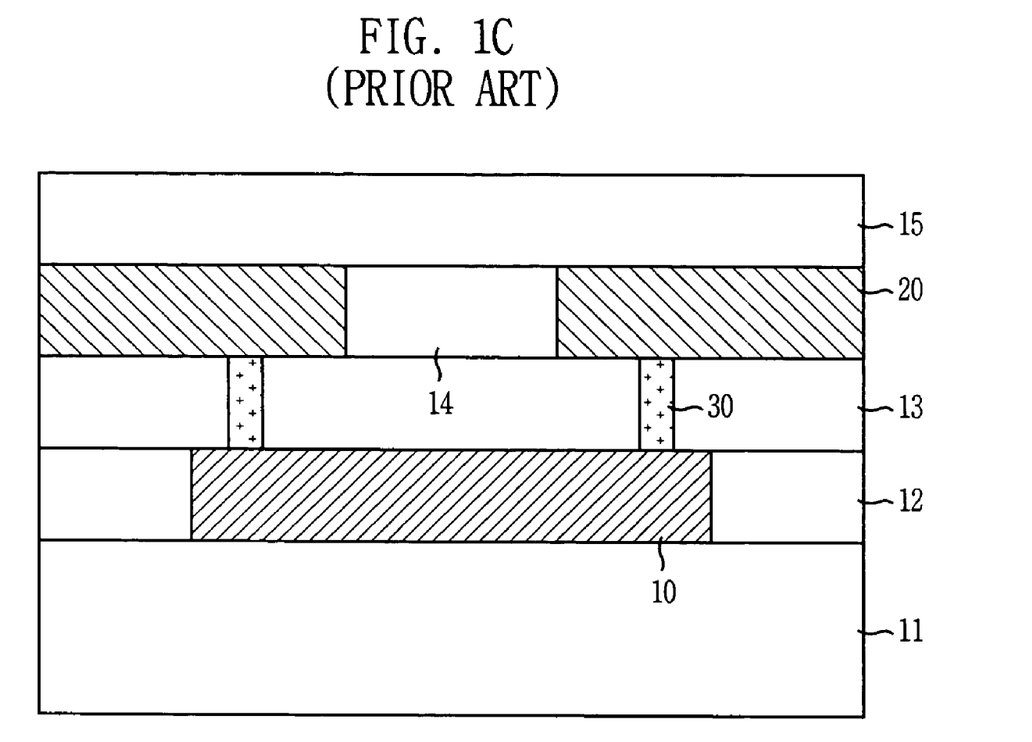
FIG. 1C is a cross-sectional view of the conventional copper interconnection line structure taken along a direction of a line B-B' shown in FIG. 1A.

FIG. 1A is a top view illustrating a conventional copper interconnection line structure for measuring an EM. FIG. 1B is a cross-sectional view of the conventional copper interconnection line structure taken along a direction of a line A-A' shown in FIG. 1A. FIG. 1C is a cross-sectional view of the conventional copper interconnection line structure taken along a direction of line B-B' shown in FIG. 1A.

Referring to FIG. 1A, a plurality of bottom metal patterns 10 are connected to a plurality of top metal patterns 20 through a plurality of via contacts 30 in a chain structure. Each of the top metal patterns 20 is connected to a plurality of corresponding aluminum pads 40.

Referring to FIG. 1B, the plurality of copper interconnection lines 10 is formed on a bottom layer 11, i.e., an insulation layer formed on a semiconductor substrate (not shown). Although not shown, the plurality of bottom copper interconnection lines 10 are connected to a reacted region or another region of the substrate through the plurality of contacts formed through the bottom layer 11. And the plurality of the bottom copper interconnection lines 10 are formed on the bottom layer 11 in a same distance.

Next, a first inter-layer insulation layer 12 is formed for insulation between the plurality of bottom copper interconnection lines 10. Then, an inter-metal insulation layer 13 is formed on the plurality of bottom copper interconnection lines 10 and the first inter-layer insulation layer 12. The plurality of top copper interconnection lines 20 are formed on the inter-metal insulation layer 13 in a same distance. Herein, the plurality of bottom copper interconnection lines 10 and the plurality of top copper interconnection lines 20 are interconnected through the plurality of the via contact 30.

The plurality of top copper interconnection lines 20 are insulated by the second inter-layer insulation layer 14 and a passivation layer 15 completely covering the plurality of bottom copper interconnection lines 20 and the second inter-layer insulation layer 14 is formed.

Referring to FIG. 1C, one of the plurality of bottom copper interconnection lines 10 is electrically connected to two of the plurality of top copper interconnection lines 20 by passing the inter-metal insulation layer 13 through the plurality of via contacts 30. Therefore, a chain contact structure is formed.

Although not shown, the passivation layer is formed on the plurality of top copper interconnection lines 20 through proceeding an etching process.

However, a final interpretation of a method for measuring the wafer level EM having the above copper interconnection line structure can be changed depending on a condition provided by each test. There may be a mis interpretation of a data due to a phenomenon that probe slides from the aluminum pad while measuring. Also, a failure of wiring produced by a failure of a passivation layer process may be misinterpreted.

SUMMARY OF THE INVENTION

It is, therefore, an object of the present invention to provide a test pattern for a reliability measurement of a copper interconnection line having a moisture window and a method for manufacturing the same capable of measuring an EM under a more severe condition than an actual measuring condition by making moisture flow in through forming a window that makes the moisture possible to penetrate an inter-layer insulation layer.

In accordance with an aspect of the present invention, there is provided a test pattern for a reliability measurement of a copper interconnection line, including: a semiconductor substrate; a first inter-layer insulation layer formed on the substrate; a plurality of bottom copper interconnection lines filled in the first inter-layer insulation layer; a second inter-layer insulation layer on the plurality of bottom copper interconnection lines and the first inter-layer insulation layer; a plurality of top copper interconnection lines filled in the second inter-layer insulation layer and connected to the plurality of bottom copper interconnection lines through the plurality of via contacts; and a passivation layer covering the plurality of top copper interconnection lines and having a plurality of moisture windows in which the moisture is flown during an electro migration test.

In accordance with another aspect of the present invention, there is provided a method for fabricating a test pattern for reliability measurement of a copper interconnection line with a moisture window, including the steps of: forming a trench inside of the first inter-layer insulation layer on the substrate; forming the second inter-layer insulation layer on the plurality of bottom copper interconnection lines and the first inter-layer insulation layer; forming the plurality of top copper interconnection lines buried in the second inter-layer insulation layer through a dual damascene process and connected to the plurality of bottom copper interconnection lines through a plurality of via contacts; and forming a passivation layer provided with the plurality of moisture windows allowing the moisture to flow in while testing the EM and covering the second inter-layer insulation layer and the plurality of top copper interconnection lines.

In accordance with further aspect of the present invention, there is provided a method for fabricating a test pattern for reliability measurement of a copper interconnection line with a moisture window, including the steps of: forming the plurality of bottom copper interconnection lines connected to the plurality of top copper interconnection lines through the plurality of the via contacts; forming the passivation layer provided with the moisture window allowing the moisture to flow in the top portion of the plurality of top copper interconnection lines during the reliability measurement; measuring a degree of resistance of the plurality of top copper interconnection lines and the plurality of bottom copper interconnection lines in the air; measuring again the degree of resistance of the plurality of top copper interconnection lines and the plurality of bottom copper interconnection lines on a hot plate by applying a heat process; and finishing the reliability measurement at a point where the resistance change of the bottom copper interconnection line and the top copper interconnection line is great.

BRIEF DESCRIPTION OF THE DRAWINGS

The above and other objects and features of the present invention will become better understood with respect to the following description of the preferred embodiments given in conjunction with the accompanying drawings, in which.

DETAILED DESCRIPTION OF THE INVENTION

A method for a test pattern for measuring a reliability of a copper interconnection line having a moisture window and a method for manufacturing the same in accordance with a preferred embodiment of the present invention will be described in detail with reference to the accompanying drawings.

The present invention relates to a method of an EM test using a diffusion phenomenon of a copper atom due to moisture. In general, there happens a diffusion phenomenon that copper atoms of a copper interconnection line flows out into an inter-layer insulation layer due to the moisture flown in from outside or the moisture remaining in an inter-layer insulation layer surrounding the copper interconnection line.

For instance, the present invention uses the diffusion phenomenon of the copper atoms due to the moisture; and more particularly uses a theory that a possibility of failing during the actual EM test of the copper interconnection line apparently decreases if failing is not taken place for a test of a diffusion barrier layer by testing a reliability of the diffusion barrier layer by compulsorily promoting the diffusion phenomenon of the copper atoms.

For reducing the possibility of failing during the EM measurement, the EM test is proceeded under the more severe condition than the actual EM test by forming the moisture window to flow in the moisture.

If a result of the EM test performed under the more severe condition than an actual EM test shows good, a property of the EM of an actual copper interconnection line is good.

In accordance with a preferred embodiment of the present invention, a test pattern for a reliability measurement of a copper interconnection line having a moisture window and a method of manufacturing the same is explained in more detail.

Figure 2A:
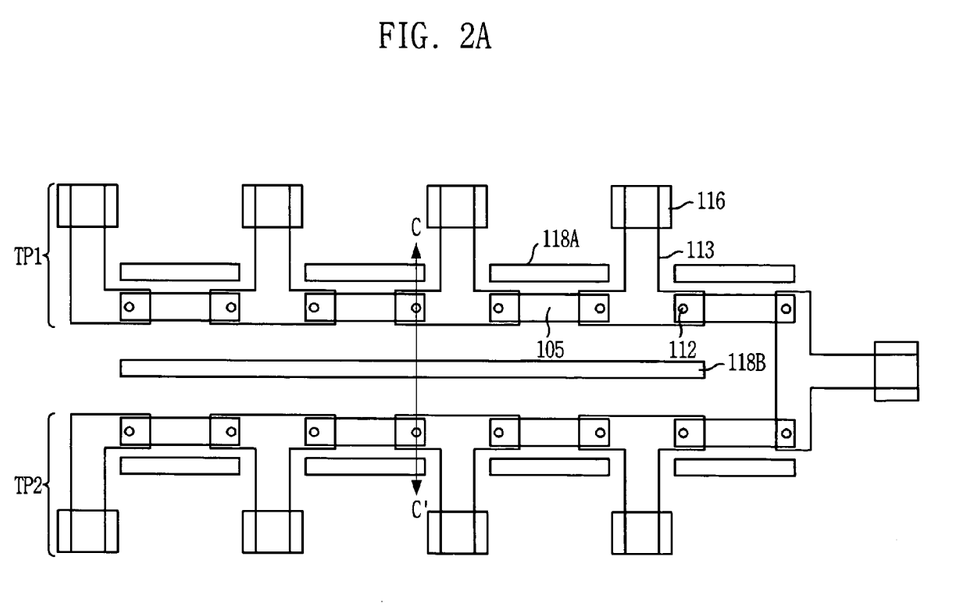
FIG. 2A is a layout illustrating a test pattern for a reliability measurement of a copper interconnection line having a moisture window in accordance with a preferred embodiment of the present invention.

FIG. 2A is a layout illustrating a test pattern for a reliability measurement of a copper interconnection line having a moisture window in accordance with a preferred embodiment of the present invention.

Referring to FIG. 2A, a plurality of test pattern groups TP1 and TP2 connected in a chain shape through a plurality of via contacts 112 is a combination body of segments having two of a plurality of bottom copper interconnection lines 105 are connected to one of a plurality of top copper interconnection lines 113, i.e., a structure connecting two of the plurality of bottom copper interconnection lines 105 to one of the plurality of top copper interconnection lines 113 through the plurality of via contacts 112 placed at two ending points of the plurality of bottom copper interconnection lines 105. The top copper interconnection line 113 of each segment is connected to each corresponding aluminum pad 116. Therefore, one segment includes one top copper interconnection line 113 and one bottom copper interconnection line connected to one aluminum pad 116. A structure of the test pattern group explained in the above is same as that shown in FIG. 1A.

The present invention forms a plurality of moisture windows 118A and 118B to make the moisture flow in during the test. The moisture windows 118A and 118B are formed between the plurality of top copper interconnection lines 113 of each segment consisting one test pattern group or between the plurality of test pattern groups. Herein, a reference numeral 118A denotes the moisture window which is relatively short compared to the moisture window 118B formed between the plurality of test pattern groups.

Figure 2B:
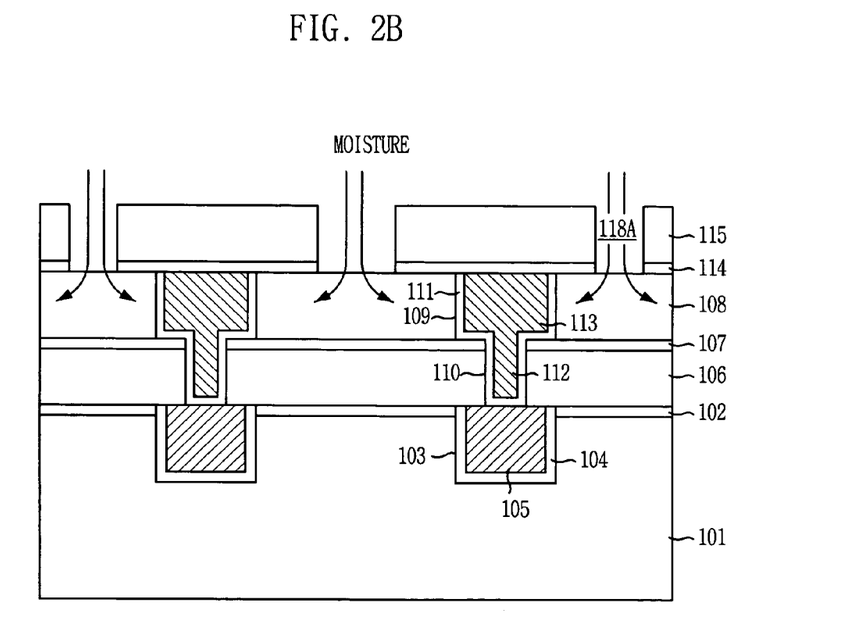
FIG. 2B is a cross-sectional view taken along a direction of a line C-C' shown in FIG. 2A.

FIG. 2B is a cross-sectional view taken along a direction of line C-C' shown in FIG. 2A.

Referring to FIG. 2B, a first inter-layer insulation layer 101 and a first etch barrier layer 102 is stacked on the substrate (not shown) having devices such as a transistor. Then, a first trench 103 in which the bottom copper interconnection line is formed is formed on the first inter-layer insulation layer 101 and the first etch barrier layer 102. A first diffusion barrier layer 104 is formed inside of the first trench 103 and the bottom copper interconnection line 105 is formed filling a space surrounded by the first diffusion barrier layer 104 within the first trench 103.

An inter-metal insulation layer 106, a second etch barrier layer 107 and a second inter-layer insulation layer 108 are stacked on the bottom copper interconnection line 105 and the first etch barrier layer 102. A plurality of via holes 110 are formed inside of a layer stacking the inter-metal insulation layer 106 and the second etch barrier layer 107. A plurality of second trenches 109 are formed inside of the second inter-layer insulation layer 108. The plurality of second trenches 109 and the plurality of via holes 110 are dual damascene patterns typically formed by a dual damascene process. The plurality of second trenches 109 are line patterns and the plurality of via holes 110 are hole patterns.

Next, a second diffusion barrier layer 111 is formed inside of the plurality of second trenches 109 and the plurality of via holes 110. A plurality of bottom interconnection lines 113 and the plurality of via contacts 112 are formed to fill a space surrounded by the second diffusion barrier layer 111 within the plurality of second trenches 109 and the plurality of via holes 110. Herein, the plurality of top copper interconnection lines 113 and the plurality of via contacts 112 have the same structures. After being formed with use of a plating method, the plurality of top copper interconnection lines 113 and the plurality of via contacts have flat surfaces through a chemical and mechanical polishing (CMP) process.

Next, a third etch barrier layer 114 and a passivation layer 115 are stacked on the plurality of top copper interconnection lines 113 and the second inter-layer insulation layer 108. The moisture window 118A is formed inside of the third etch barrier layer 114 and the passivation layer 115. Herein, the moisture window 118A is not formed in a shape to expose the plurality of top copper interconnection lines 113. Therefore, the passivation layer 115 and the third etch barrier layer 114 providing the plurality of moisture windows 118A covers the plurality of top copper interconnection lines 113. A reason that the moisture window 118A is not formed to directly expose the plurality of top copper interconnection lines 113 is to prevent oxidation of the plurality of top copper interconnection lines 113 caused by that the moisture flown in through the moisture window 118A directly touches the plurality of top copper interconnection lines 113.

Referring to FIGS. 2A to 2B, the first etch barrier layer 102, the second etch barrier layer 107 and third etch barrier layer 114 are made up of a silicon nitride layer ($Si_3N_4$). The first diffusion barrier layer 104 and the second diffusion barrier layer 111 for preventing that the copper atoms of the plurality of bottom copper interconnection lines 105 and the plurality of top copper interconnection lines 113 diffuses into the fist inter-layer insulation 101, second inter-layer insulation layer 108 and the inter-metal insulation layer 106 as oxides may be stacked with TiN, Ti, and Ti/TiN.

Figure 3A:
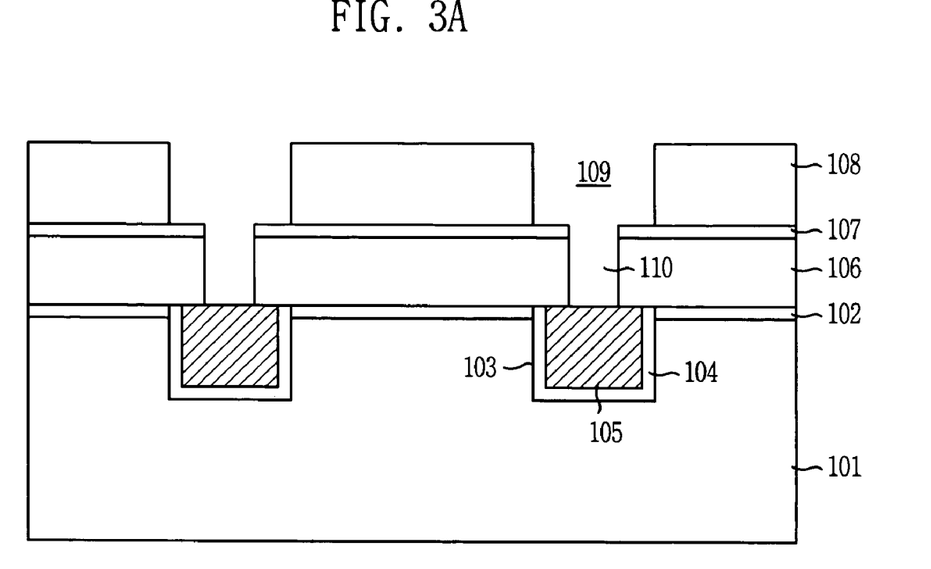
FIGS. 3A to 3D are cross-sectional views illustrating a method for manufacturing a test pattern for a reliability measurement of a copper interconnection line according to a line C-C' shown in FIG. 2A.

Referring to FIG. 3A, the first inter-layer insulation layer 101 and the first etch barrier layer 102 are formed on the substrate (not shown) having devices such as transistors formed on a surface of the substrate. Then, the first trench 103 is formed by etching the first etch barrier layer 102 and the first inter-layer insulation layer 101 simultaneously.

Next, the first diffusion barrier layer 104 and the copper layer are formed on the substrate to fill the first trench 103. Then the plurality of bottom copper interconnection lines 105 are formed through the CMP process to remain the whole copper layer on the first etch barrier layer 102 only in the first trench 103. Herein, the plurality of bottom copper interconnection lines 105 serve a role for filling a space surrounded by the first diffusion barrier layer 104 within the first trench 103 and the first diffusion barrier layer 104 serves a role for preventing that the copper atoms of the plurality of bottom copper interconnection lines 105 diffuse into the first inter-layer insulation layer 101 as oxides.

Next, the inter-metal insulation layer 106, the second etch barrier layer 107 and the second inter-layer insulation layer 108 are stacked on the first etch barrier layer 102 including the plurality of bottom copper interconnection lines 105. Then, through the dual damascene process, the plurality of via holes 110 exposing a part of the plurality of bottom copper interconnection lines 105 formed under the plurality of second trenches having line shapes.

Figure 3B:
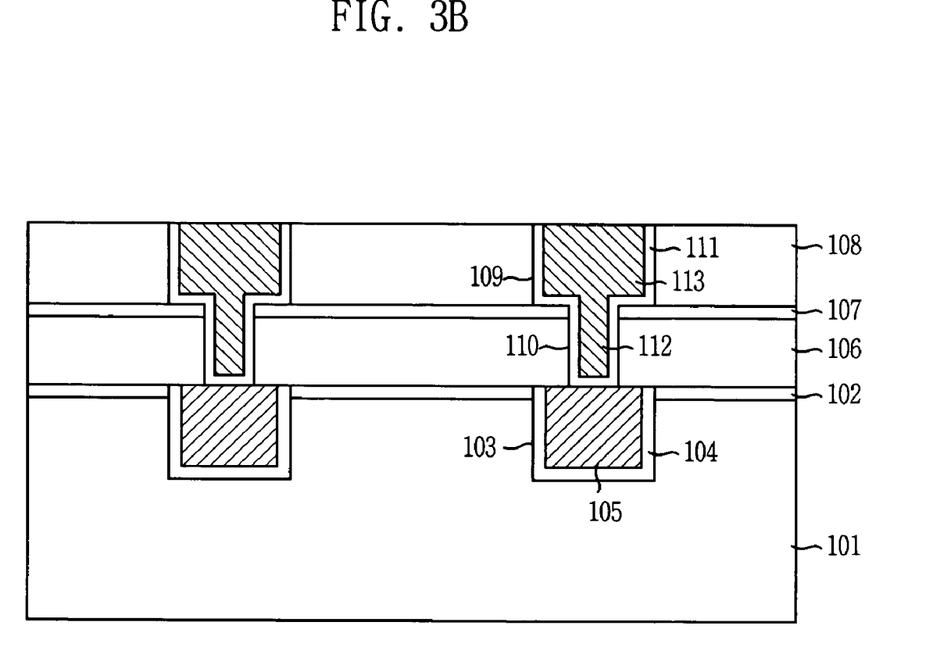

Referring to FIG. 3B, to fill the plurality of second trenches 109 and the plurality of via holes 110, the second diffusion barrier layer 111 and the copper layer are formed on all sides of the second trench 109. Then, the plurality of via contacts 112 and the plurality of top copper interconnection lines 113 are formed at once filling a space surrounded by the second diffusion barrier 111 within the plurality of second trenches 109. The second diffusion barrier layer 111 serves a role to prevent the copper atoms of the plurality of top copper interconnection lines 113 and the plurality of via contacts 112 from diffusing into the inter-metal insulation layer 106 and the second inter-layer insulation layer 108 which are oxides.

Figure 3C:
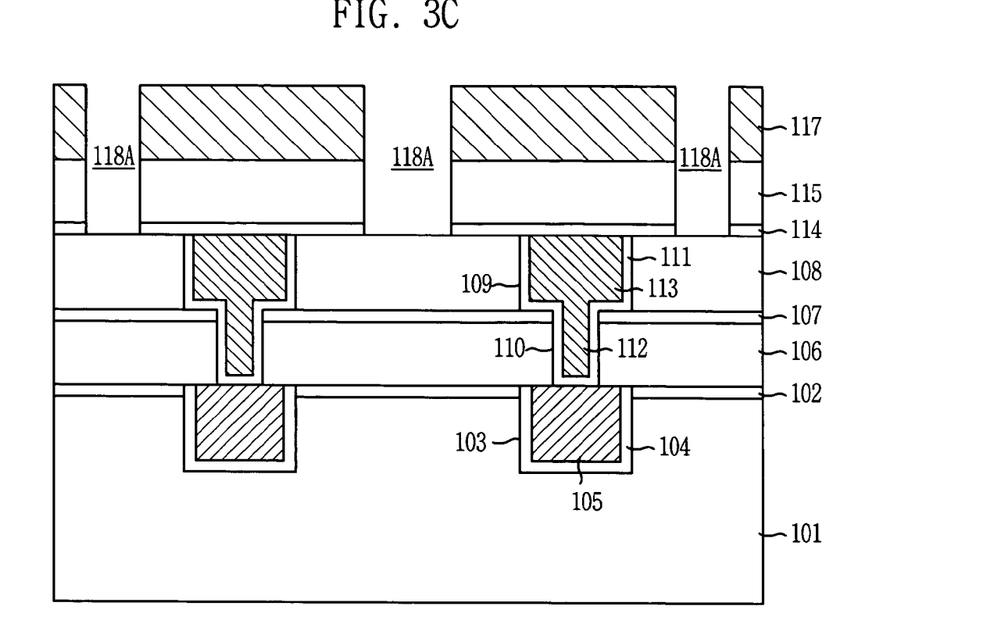

Referring to FIG. 3C, the third etch barrier layer 114 and passivation layer 115 are sequentially stacked on the second inter-layer insulation layer 108 including the plurality of top copper interconnection lines 113. Herein, the third etch barrier layer 114 serves a role to prevent the second inter-layer insulation 108 from being etched back while the etching process is applied to the passivation layer for forming the aluminum pad and the moisture window performed during subsequent processes.

Next, a pad mask (not shown) is formed through a mask using a photosensitive layer on the passivation layer and the etching process. Afterwards, the passivation layer 115 and the third etch barrier layer 114 are sequentially subjected to a pad etching process with use of the pad mask as an etch mask. An opening unit exposing an end point of the plurality of top copper interconnection lines 113 is formed. Then, the plurality of aluminum pads 116 as shown in FIG. 2A is formed by depositing the plurality of aluminum pads on all sides of the plurality of top copper interconnection lines 113 including the opening unit and applying the etching process to the plurality of top copper interconnection lines 113 including the opening unit. Herein, the plurality of aluminum pads 116 as shown in FIG. 2A connects to each corresponding top copper interconnection line 113 to make it possible to find out the plurality of top copper interconnection lines showing failing results.

Next, the photosensitive layer is formed again on the passivation layer 115 and a plurality of moisture window mask 117 is formed for forming the moisture window through an additional mask and the etching process. Then, the moisture window 118A is formed by applying the etching process to a part of the passivation layers 115 and the third etch barrier layer 114 with use of the moisture window mask 115 as the etch mask. Herein, the reference numeral 118A denotes the plurality of moisture windows having relatively short lengths compared to the moisture window shown in FIG. 2A.

Figure 3D:
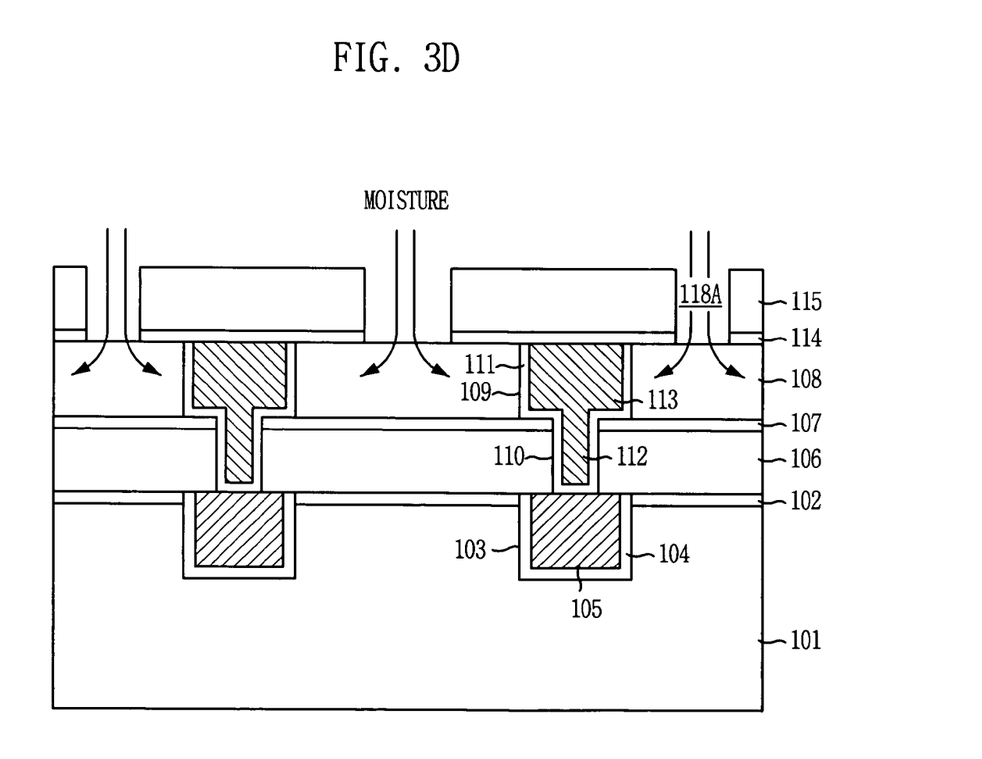

Referring to FIG. 3D, the moisture window mask is removed. The second inter-layer insulation layer 108 is a portion exposed under the moisture window 118A formed through a series of processes illustrated in the above. That is, the plurality of moisture windows 118A having a line shape is located on the second inter-layer insulation layer 108 between the top copper interconnection lines 113.

The plurality of moisture windows 118A shown in FIG. 2A, are formed between each segment of the test pattern groups forming a chain structure connected by the plurality of via contacts. The other moisture window denoting the reference numeral 118B is a window having a long length formed between the test pattern groups.

As illustrate in the above, after forming the moisture window 118A and 118B, the moisture in the air flows into the second inter-layer insulation layer 108 through the plurality of moisture windows 118A and 118B. And the moisture flown into the second inter-layer insulation layer diffuses into a sidewall of the plurality of top copper interconnection lines 113 while the EM test and finally deteriorates a condition of the EM test.

Next, an explanation about the method of the EM test of the copper interconnection line in accordance with the present invention is following.

In order to observe the EM phenomenon, a resistance of the test pattern in the air is measured. Then, the wafer is put on a hot plate and is subjected to a heat treatment performed at a temperature of 350° C. Afterwards, the resistance is measured again and then, results of the each test are compared.

When comparing the results, the EM measurement is finished at a point where the resistance greatly changes. Herein, the point where the resistance greatly changes represents a moment when the moisture in the air is flown in through the moisture window. Then, the moisture flown in is applied to a heat treatment. While applying the heat treatment to the moisture flown in, a diffusion of the copper atoms of the plurality of bottom copper interconnection lines 105 and the plurality of top copper interconnection lines 113 is compulsorily promoted. Therefore, a change in the resistance of the plurality of copper interconnection lines is great.

If the result of the EM test shows good, which means there is almost no change in the resistance, a property of the EM of the plurality of the copper interconnection lines is good. If the result of the EM test shows failing, which means there is a great change in the resistance, the property of the EM of the plurality of copper interconnection lines is poor.

Figure 4:
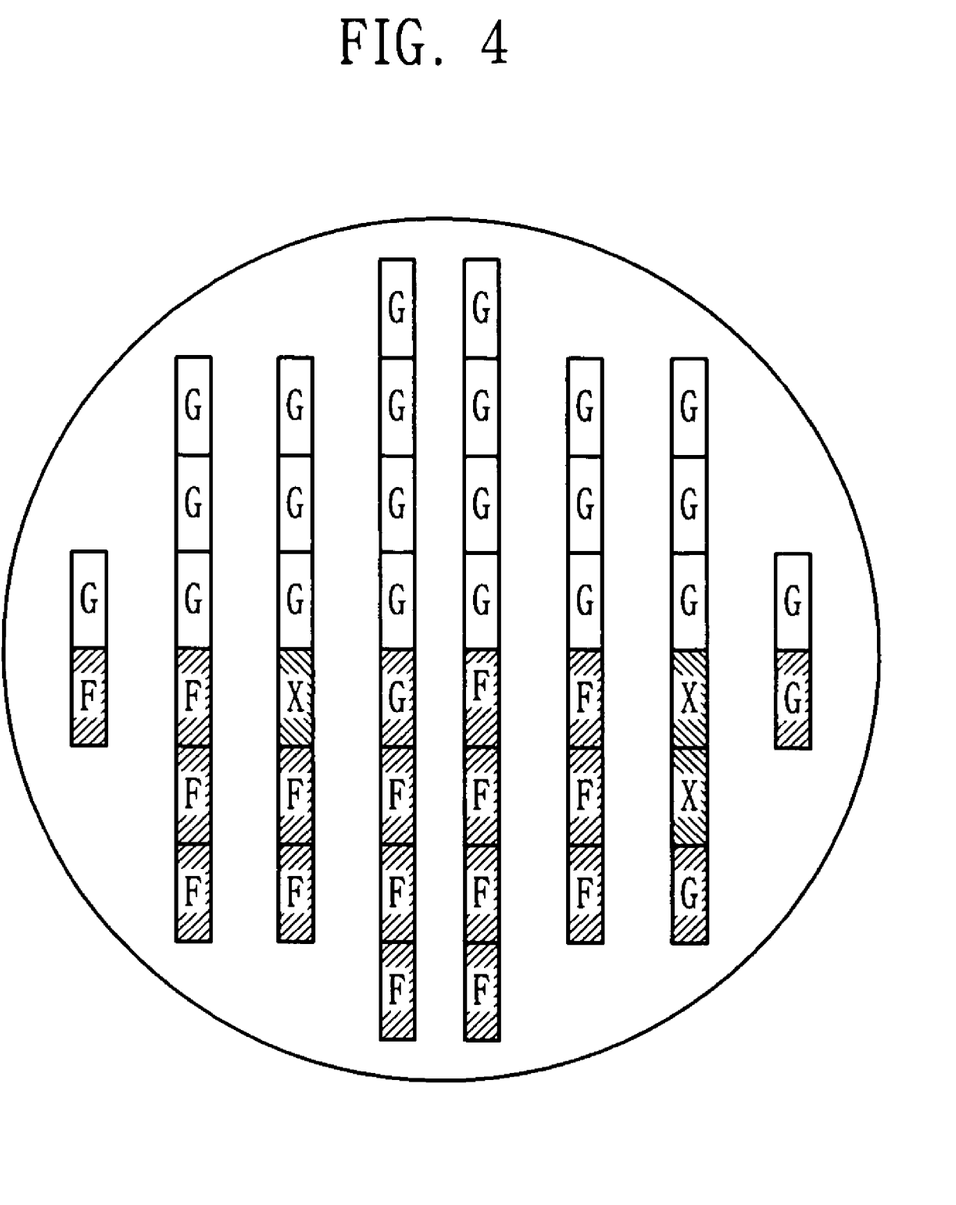
FIG. 4 is a result of an EM test on a wafer including both a test pattern with and without a moisture window.

FIG. 4 is the result of the EM test on the wafer including both test patterns with and without the moisture window. Referring to FIG. 4, a mark G represents 'good', a mark F represents 'fail', and a mark X represents 'die' generating failing before a heat treatment. And a white rectangular represents the test pattern without the moisture window and a hatched rectangular represents the test pattern with the moisture window. All of the results shown in FIG. 4 are obtained after applying the heat treatment to the moisture flown in through the moisture window for 1 hour.

Referring to FIG. 4, in case of performing the EM test by applying the heat treatment for 1 hour, the test pattern with the moisture window has more possibility of having F than the test pattern without the moisture window. For instance, as for the test pattern without the moisture window, no dies produce F after the heat treatment. However, as for the test pattern with the moisture window, only 2 dies out of 17 dies do not produce F except for the 3 dies marked by X shown in FIG. 4 which is failed before applying the heat treatment after forming the moisture window formed after the heat treatment.

In accordance with a preferred embodiment of the present invention, the plurality of bottom copper interconnection lines 105 and the plurality of top copper interconnection lines 113 are made up of pure copper layers. However, a copper compound metal can be used to form the plurality of bottom and top copper interconnection lines. Also, instead of using the plating method for forming the copper layer, a sputtering method can be used. Furthermore, instead of the CMP process for planarizing the surface of the copper layer, the etching process can be applied.

The present invention compulsorily promotes the diffusion of the copper atoms by forming the plurality of moisture windows on the test pattern structure for the EM measurement.

Furthermore, the present invention uses the test pattern capable of accelerating the diffusion of the copper atoms, thereby obtaining a very fast feed back. Therefore, it enables to fabricate the semiconductor device timely.

The present application contains subject matter related to the Korean patent application No. KR 2003-0081395, filed in the Korean Patent Office on Nov., 18, 2003 the entire contents of which being incorporated herein by reference.

While the present invention has been described with respect to certain preferred embodiments, it will be apparent to those skilled in the art that various changes and modifications may be made without departing from the spirit and scope of the invention as defined in the following claims.

What is claimed is:

1. A method for fabricating a test pattern for reliability measurement of a copper interconnection line with a moisture window, comprising the steps of:

forming a trench inside a first inter-layer insulation layer on the substrate;

forming a second inter-layer insulation layer on a plurality of bottom copper interconnection lines and the first inter-layer insulation layer;

forming a plurality of top copper interconnection lines buried in the second inter-layer insulation layer through a dual damascene process and connected to the plurality of bottom copper interconnection lines through a plurality of via contacts; and forming a plurality of passivation layers above the second inter-layer insulation layer and the plurality of top copper interconnection lines, each passivation layer having a width broader than a corresponding top copper interconnection line to cover the corresponding top copper interconnection line; and forming a plurality of moisture windows between the plurality of passivation layers to open a top portion of the second inter-layer insulation layer allowing moisture to flow in through the second inter-layer insulation layer to flow into the top copper interconnection lines during an electro migration (EM) test, wherein each of the plurality of moisture windows is a line shaped window opening a top portion of the second inter-layer insulation layer, wherein the step of forming the passivation layer comprises the steps of:

forming the passivation layer covering the second inter-layer insulation layer and the plurality of top copper interconnection lines;

opening one side of the plurality of top copper interconnection lines by applying a pad etching process to the passivation layer;

forming a plurality of aluminum pads connected to the each corresponding top copper interconnection lines; and forming a moisture window mask on the passivation layer and the plurality of aluminum pads.

2. The method of claim 1, wherein the moisture window is a line shaped window opening a top portion of the second inter-layer insulation layer in order to make the moisture flown in through the second inter-layer insulation layer to flow into the top copper interconnection line.

3. The method of claim 1, wherein the plurality of bottom copper interconnection lines and the plurality of top copper interconnection lines are surrounded by a diffusion barrier layer for preventing a diffusion of the copper atoms.

* * * * *